US010459554B2

(12) United States Patent
Funayama et al.

(10) Patent No.: US 10,459,554 B2
(45) Date of Patent: Oct. 29, 2019

(54) DISPLAY DEVICE

(71) Applicant: Japan Display Inc., Minato-ku (JP)

(72) Inventors: Yukihide Funayama, Tokyo (JP); Kazuki Tamanaga, Tokyo (JP)

(73) Assignee: Japan Display Inc., Minato-ku (JP)

( * ) Notice: Subject to any disclaimer, the term of this patent is extended or adjusted under 35 U.S.C. 154(b) by 200 days.

(21) Appl. No.: 15/360,259

(22) Filed: Nov. 23, 2016

(65) Prior Publication Data

US 2017/0148702 A1    May 25, 2017

(30) Foreign Application Priority Data

Nov. 24, 2015  (JP) ................................. 2015-228900

(51) Int. Cl.
*G06F 3/041*    (2006.01)
*G02F 1/1345*   (2006.01)
(Continued)

(52) U.S. Cl.
CPC ........ *G06F 3/0412* (2013.01); *G02F 1/13452* (2013.01); *G02F 1/13454* (2013.01); *G02F 1/133385* (2013.01); *G06F 3/044* (2013.01); *G06F 3/0416* (2013.01); *G02F 1/13338* (2013.01); *H01L 2924/14* (2013.01);
(Continued)

(58) Field of Classification Search
CPC ......... G02F 1/133308; G02F 1/133385; G02F 1/13454; G02F 1/13452; G02F 1/13338; H01L 23/36; G06F 3/044; G06F 3/0416; G06F 3/0412; H05K 1/147; H05K 2201/10128; H05K 1/0203
See application file for complete search history.

(56) References Cited

U.S. PATENT DOCUMENTS

2008/0024714 A1*  1/2008  Park .................... G02F 1/13452
                                              349/150
2012/0273928 A1* 11/2012  Kim ........................ H01L 23/36
                                              257/668
(Continued)

FOREIGN PATENT DOCUMENTS

JP    2005-78720 A     3/2005
JP    2005-276943 A   10/2005
(Continued)

OTHER PUBLICATIONS

Japanese Office Action dated Mar. 5, 2019 in Japanese Patent Application No. 2015-228900 (with unedited computer generated English translation), citing documents AL through AV therein, 12, pages.

*Primary Examiner* — Nitin Patel
*Assistant Examiner* — Amy Onyekaba
(74) *Attorney, Agent, or Firm* — Oblon, McClelland, Maier & Neustadt, L.L.P.

(57) ABSTRACT

According to one embodiment, a display device includes a first substrate including a display area containing a plurality of pixels and a non-display area, a drive circuitry on the non-display area of the first substrate and connected to the plurality of pixels, a second substrate opposed to the first substrate, a touch sensor including detection electrodes on the second substrate, and a third substrate including first wiring lines connected to the detection electrodes and a heat radiation layer thermally connected to the drive circuitry.

14 Claims, 10 Drawing Sheets

(51) Int. Cl.
    *G02F 1/1333* (2006.01)
    *G06F 3/044* (2006.01)
    *H05K 1/02* (2006.01)
    *H05K 1/14* (2006.01)

(52) U.S. Cl.
    CPC ........... *H05K 1/0203* (2013.01); *H05K 1/147* (2013.01); *H05K 2201/10128* (2013.01)

(56) References Cited

U.S. PATENT DOCUMENTS

| | | | | |
|---|---|---|---|---|
| 2014/0167245 | A1* | 6/2014 | Kim | H01L 23/36 257/712 |
| 2014/0362326 | A1* | 12/2014 | Terazawa | G02F 1/133308 349/58 |
| 2015/0268797 | A1* | 9/2015 | Kurasawa | G06F 3/0418 345/174 |
| 2015/0309636 | A1* | 10/2015 | Kurasawa | G06F 3/044 345/173 |
| 2017/0006738 | A1* | 1/2017 | Lee | G02F 1/13452 |

FOREIGN PATENT DOCUMENTS

| | | |
|---|---|---|
| JP | 2008-131501 A | 6/2008 |
| JP | 2011-2553 A | 1/2011 |
| JP | 2011-91142 A | 5/2011 |
| JP | 2012-84804 A | 4/2012 |
| JP | 2012-198375 A | 10/2012 |
| JP | 2014-26218 A | 2/2014 |
| JP | 2014-48643 | 3/2014 |
| JP | 2014-179284 | 9/2014 |
| JP | 2015-18187 A | 1/2015 |
| JP | 2015-138166 A | 7/2015 |
| JP | 2015-206815 A | 11/2015 |

\* cited by examiner

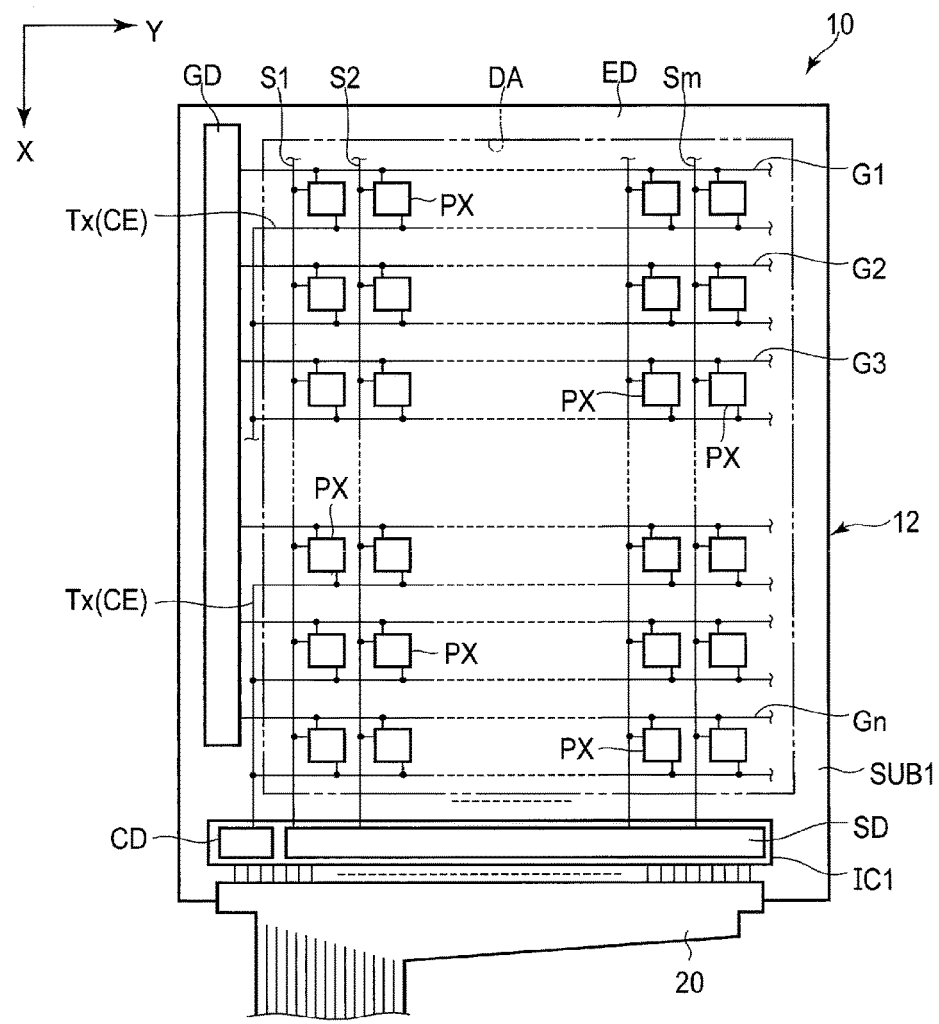
F I G. 2

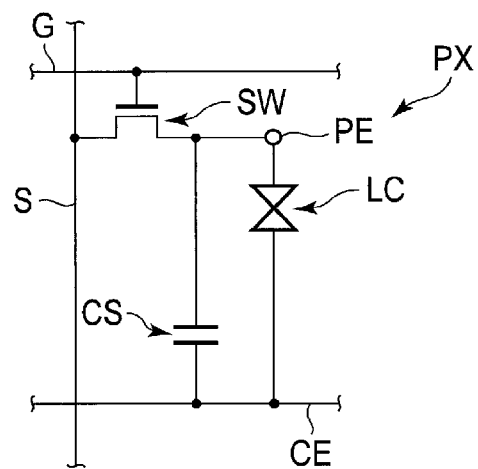
F I G. 3
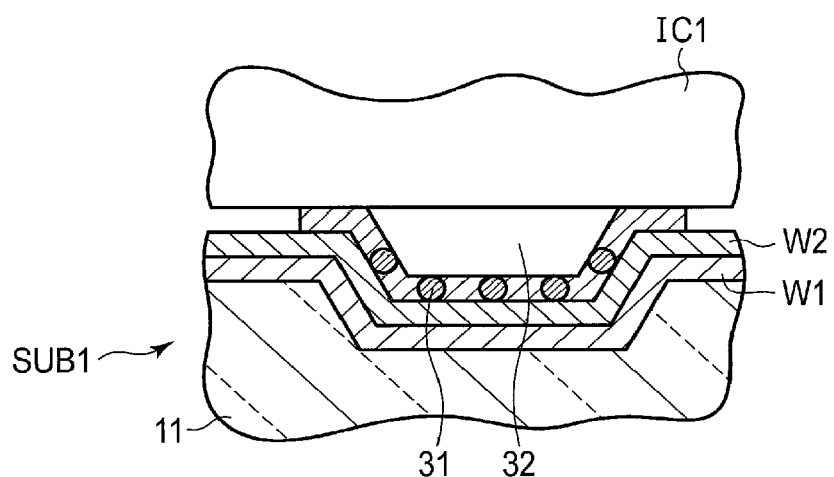
F I G. 5

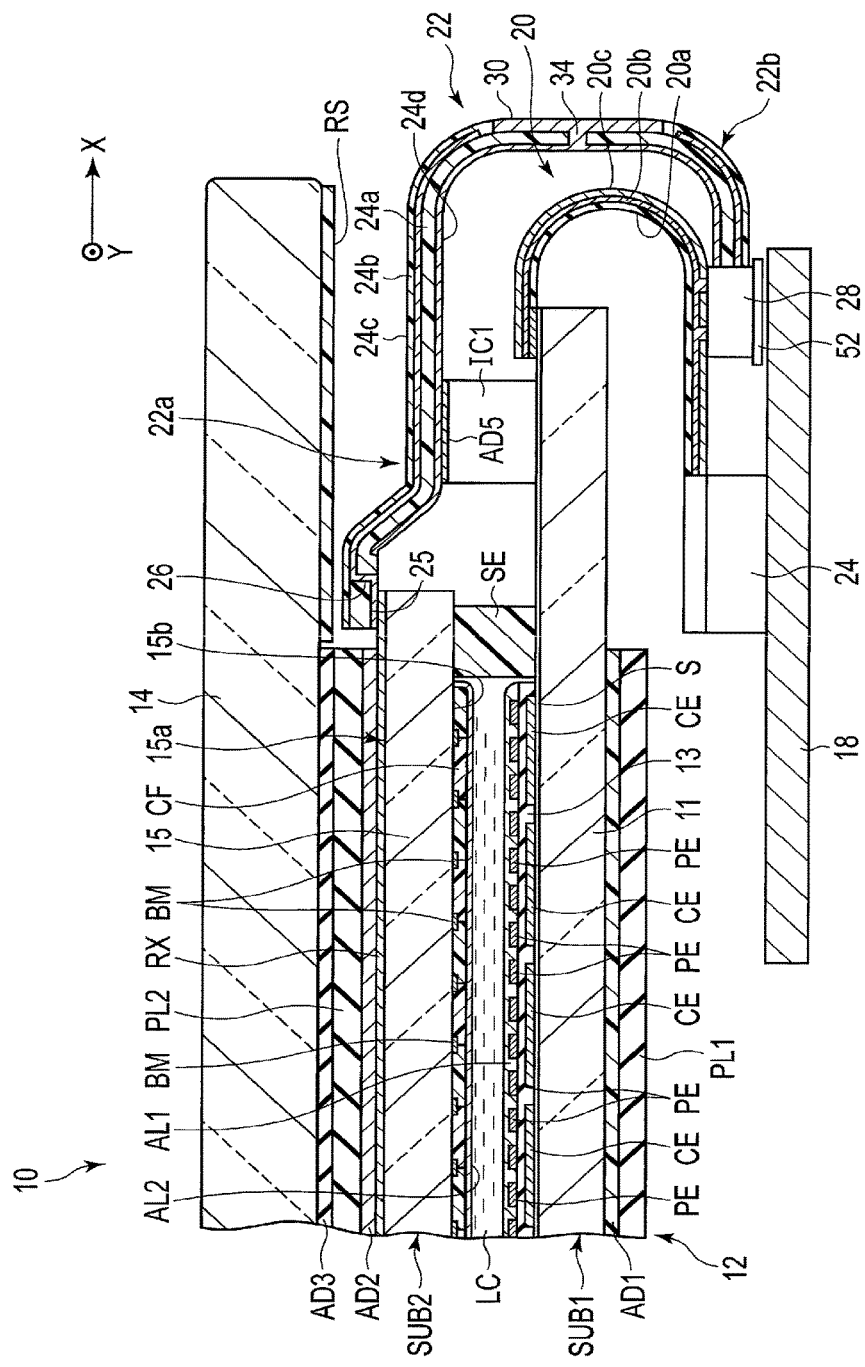
F I G. 8

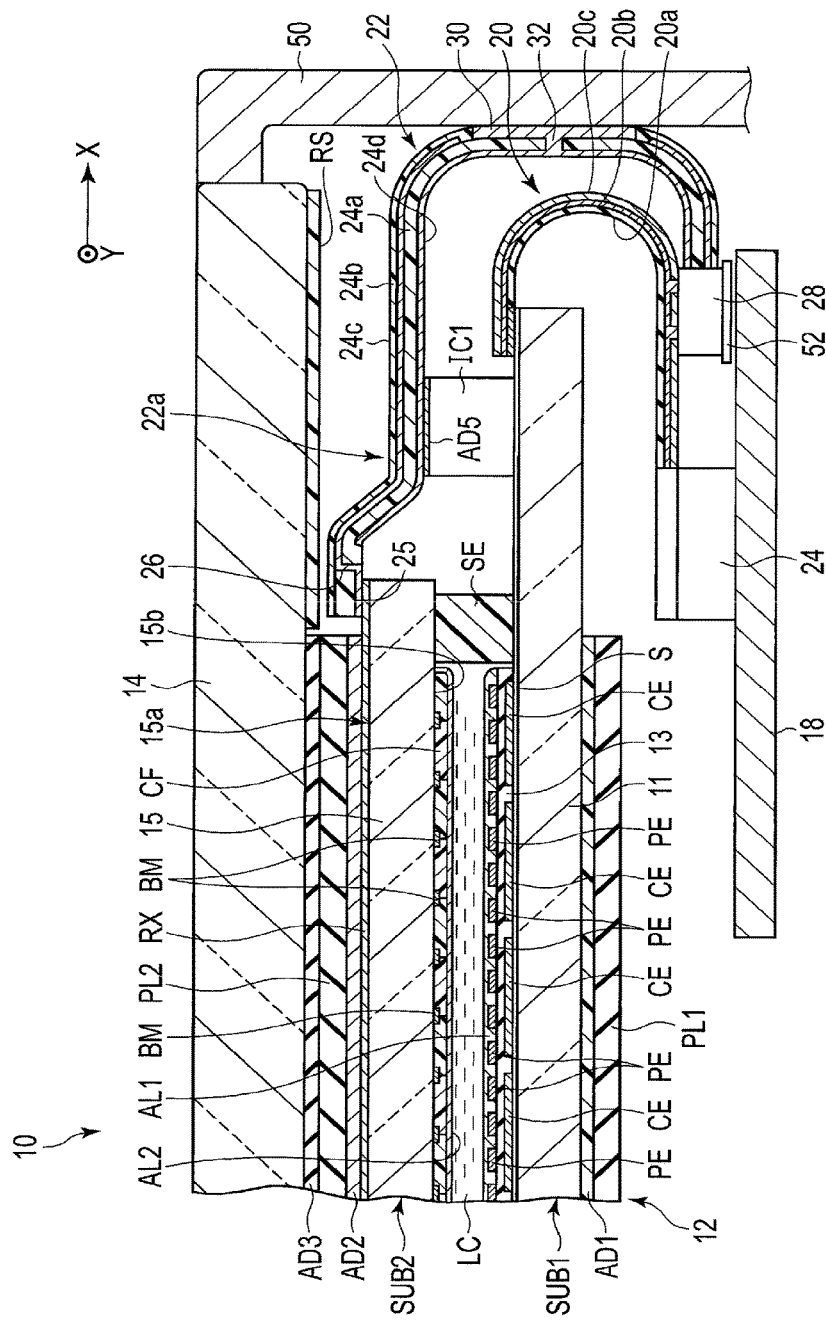
F I G. 9

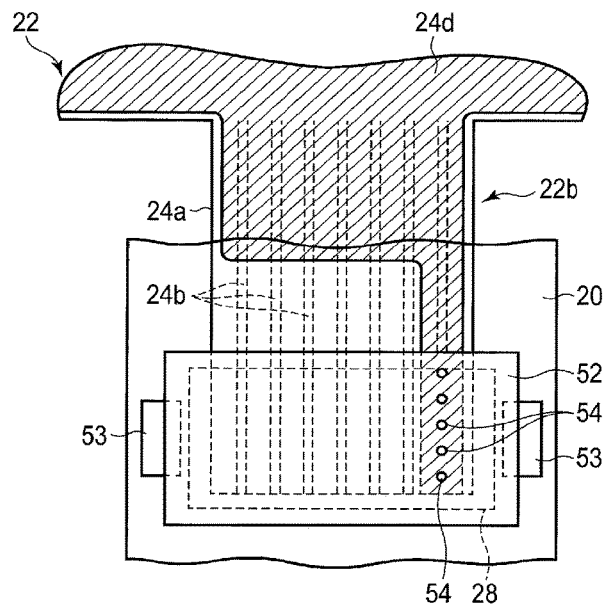
F I G. 10
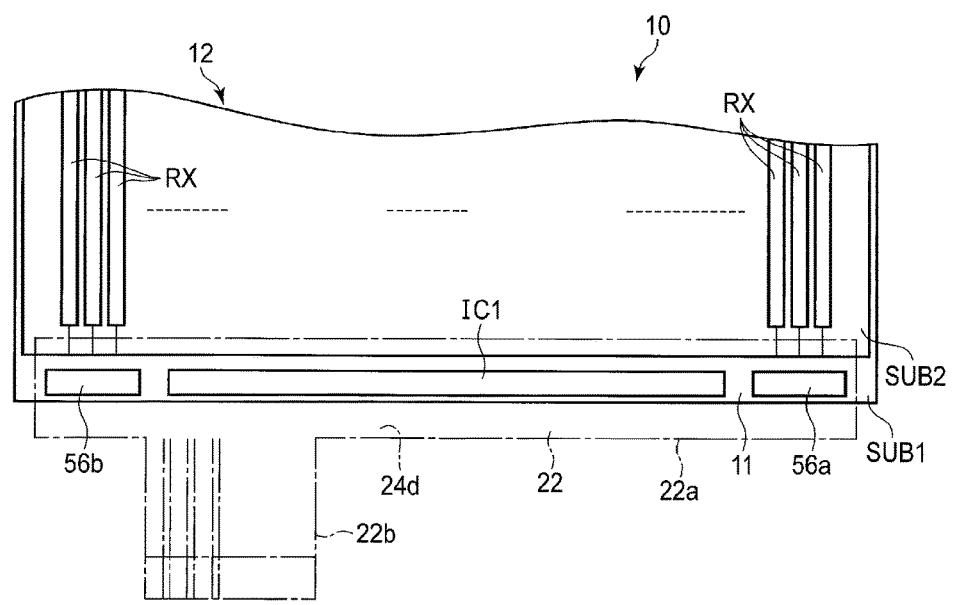
F I G. 11

DISPLAY DEVICE

CROSS-REFERENCE TO RELATED APPLICATIONS

This application is based upon and claims the benefit of priority from Japanese Patent Application No. 2015-228900, filed Nov. 24, 2015, the entire contents of which are incorporated herein by reference.

FIELD

Embodiments described herein relate generally to a display device.

BACKGROUND

In recent years, liquid crystal displays, organic electroluminescent displays, MEMS and the like are widely used as display devices of electronic devices such as smartphones, personal assistant devices (PAD) and tablet computers. These display devices usually include a glass substrate having a display area and one or more driver ICs (drive circuitries) mounted on the glass substrate in an outer portion of the display area by a COG technology or the like. A driver IC drives a large number of pixels which constitute the display area.

In more recent years, as the display devices are enlarged in size, their resolutions are enhanced and the number of additional features is increased, the amount of current flowing the drivers IC increases, which may cause an increase in the heat generation of driver ICs.

BRIEF DESCRIPTION OF THE DRAWINGS

FIG. 2 is a diagram showing a basic structure and an equivalent circuit of a display panel of the display device.

FIG. 3 is an equivalent circuit diagram of a pixel of the display panel.

FIG. 5 is a cross sectional view of a first substrate, which schematically shows the mounting portion of a driving IC chip.

FIG. 8 is a cross sectional view schematically showing a part of the structure of the display device according to the second embodiment.

FIG. 9 is a cross sectional view schematically showing a part of the structure of a display device according to the first modified example.

FIG. 10 is a plan view showing a projecting end and a connector portion of the second FPC in the display device according to the second embodiment.

FIG. 11 is a plan view schematically showing a display panel and a second FPC of a display device according to the third embodiment.

DETAILED DESCRIPTION

Figure 1:
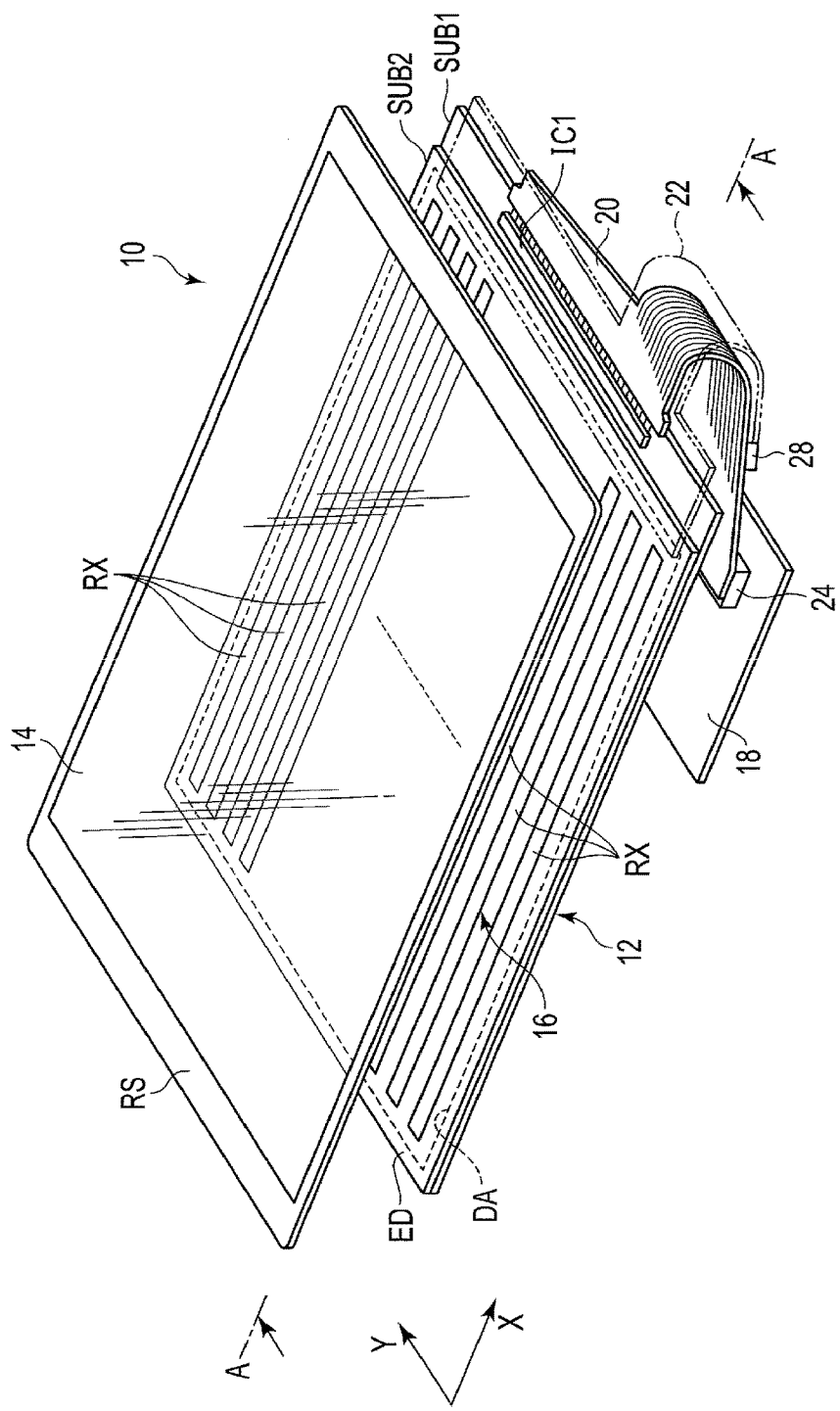
FIG. 1 is a perspective view showing a display device according to the first embodiment.

Various embodiments will be described hereinafter with reference to the accompanying drawings. In general, according to one embodiment, a display device comprises: a first substrate comprising a display area including a plurality of pixels and a non-display area; a drive circuitry on the non-display area of the first substrate and connected to the plurality of pixels; a second substrate opposed to the first substrate; a touch sensor comprising detection electrodes on the second substrate; and a third substrate comprising first wiring lines connected to the detection electrodes and a heat radiation layer thermally connected to the drive circuitry.

The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc. of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

First Embodiment

FIG. 1 is a perspective view showing a display device according to the first embodiment.

A liquid crystal display device will be described here as an example of the display device 10. The liquid crystal display device 10 is used in various electronic devices such as a smartphone, tablet computer, feature phone, notebook computer, portable game console, video camera, electronic dictionary, vehicle-installed device and television. The major configuration explained in the present embodiment can also be applied to a self-luminous display device comprising an organic electroluminescent display element, and the like, an electronic paper display device comprising an electrophoretic element, and the like, a display device employing micro-electro-mechanical systems (MEMS), or a display device employing electrochromism.

As shown in FIG. 1, the display device 10 comprises an active-matrix type display panel 12, a driving IC chip (drive circuitry) IC1 which drives the display panel 12, a transparent cover panel 14 overlaid on a display surface of the display panel 12, so as to cover the entire display surface, a touch sensor 16 which detects approaching or contact of an object to be detected, for example, a finger, a control circuit board (control module) 18, a third substrate, and a fourth substrate which connects the display panel 12 and the control circuit board 18 to each other. The third substrate connects the touch sensor 16 and the fourth substrate or the control circuit board 18 to each other. In this embodiment, as examples of the fourth and third substrates, a first flexible printed circuit board (FPC) 20 and a second flexible printed circuit board (FPC) 22 are used, respectively. Note that the third and fourth substrates are not limited to FPCs, but a rigid printed circuit board or a rigid-flexible printed circuit board (rigid-FPC) may be used as well.

The display panel 12 comprises an array substrate SUB1 in the form of a rectangular plate, which constitutes a first substrate, a counter-substrate SUB2 in the form of a rectangular plate, which constitutes a second substrate and faces the array substrate SUB1, and a liquid crystal layer LC (described later) held between the array substrate SUB1 and the counter-substrate SUB2. The display panel 12 includes a display area DA for image display and a frame-shaped non-display area ED surrounding the display area DA.

The display panel 12 is of transmissive type liquid crystal display panel having a transmissive display function to display an image by selectively transmitting light from, for example, a backlight device. Note that, instead of the transmissive display function, the display panel 12 may be a reflective display panel with a reflective display function which displays an image by selectively reflecting light from the display surface side such as external light and auxiliary light. Further, the display panel 12 may be a semi-transmissive display panel having a transmission display function and a reflective display function. If a reflective display panel 12 is used, the backlight device located on a side opposed to the array substrate SUB1 may be omitted. But, if a reflective display panel 12 is used, the backlight device may be disposed as a front light unit on a side opposed to the counter-substrate SUB2.

The touch sensor 16 comprises a plurality of detection electrodes Rx provided to oppose substantially the entire surface of the display area DA. The detection electrodes Rx are provided on, for example, a display surface side of the counter-substrate SUB2. In the example illustrated, the detection electrodes Rx are each formed into a slender belt-shape, to extend in a first direction X parallel to a long side of the display panel 12 and aligned in a second direction Y perpendicularly intersecting the first direction X. Note that the detection electrodes Rx may each extend in the second direction Y and may be aligned in the first direction X.

The driving IC chip IC1 is mounted on the array substrate SUB1 in the non-display area ED of the display panel 12. The driving IC chip IC1 is disposed, for example, close to and alongside a short side of the array substrate SUB1. The driving IC chip IC1 may comprise not only one but a plurality of IC chips. The driving IC chip IC1 functions as a signal supply source which supplies a signal necessary to drive a large number of pixels which constitute the display area DA. An end of the first FPC 20 is joined to a short-side edge of the array substrate SUB1 and wiring lines (second wiring lines) of the first FPC 20 are electrically connected to the driving IC chip IC1 through interconnecting lines on the array substrate SUB1. The first FPC 20 is drawn from the short side of the array substrate SUB1 to the outside thereof, and the other end of the first FPC 20 is connected to the control circuit board 18 through a connector 24.

An end of the second FPC 22 is joined to a short-side edge of the counter-substrate SUB2 and wiring lines (first wiring lines) of the second FPC 22 are electrically connected to the detection electrodes Rx. The second FPC 22 is drawn from the short side of the counter-substrate SUB2 to the outside thereof to cover the driving IC chip IC1. The other end of the second FPC 22 is connected to the first FPC 20 through a connector 28 provided on the first FPC 20. Thus, the wiring lines of the second FPC 22 are electrically connected to the control circuit board 18 through the wiring lines of the first FPC 20.

Note that the second FPC 22 may be directly connected to the control circuit board 18 without through the first FPC 20. Further, the second FPC 22 may be connected to the array substrate SUB1 as long as it covers the driving IC chip IC1.

The cover panel 14 is formed from a substrate different from those of the array substrate SUB1 and counter-substrate SUB2 which constitute the display panel 12, that is, for example, a rectangle plate of glass or acrylic transparent resin. The cover panel 14 has a width and length larger than outside dimensions (width, length) of the display panel 12, and an area, as viewed from top, larger than that of the display panel 12. The bottom surface (rear surface) of the cover panel 14 is adhered onto the display surface of the display panel 12 with, for example, a transparent adhesive, so as to cover the entire surface of the display panel 12. The peripheral portion of the cover panel 14 projects out over the outer circumferential edge of the display panel 12. The long sides of the cover panel 14 extend substantially parallel to the long sides of the display panel 12 while maintaining a predetermined interval with respect to the respective sides. The short sides of the cover panel 14 extend substantially parallel to the short sides of the display panel 12 while maintaining a predetermined interval with respect to the respective sides.

A frame-shaped light shielding layer RS is formed on a bottom surface (rear surface on the display panel side) of the cover panel 14. The area of the cover panel 14 other than the area opposing the display area DA of the display panel 12 is shielded by the light shielding layer RS. The light shielding layer RS may be formed on the upper surface (outer surface) of the cover panel 14.

Note that the cover panel 14 is not an essential structural component, and this embodiment is applicable also to a display device without a cover panel.

FIG. 2 is a diagram showing the basic structure and the equivalent circuit of the display panel 12 shown in FIG. 1.

The display panel 12 comprises a plurality of pixel PXs formed on the array substrate SUB1 in the display area DA. These pixel PXs are arranged in a matrix in the first direction X and in the second direction Y. Further, the display panel 12 comprises, in the display area DA, a plurality of scanning lines G (G1 to Gn), a plurality of signal lines S (S1 to Sm), common electrodes CE and the like. The scanning lines G each extend along the second direction Y, and are aligned in the first direction X. The signal lines S each extend along in the first direction X, and are aligned in the second direction Y. Note that the scanning lines G and the signal lines may not necessarily extend linearly, but may be partially bent. The common electrodes CE are each arranged over a plurality of pixel PXs and each extend, for example, in the second direction Y.

The display panel 12 comprises, in the non-display area ED, a signal line drive circuit SD, a scanning line drive circuit GD, a common electrode drive circuit CD and the like. The signal line drive circuit SD, the scanning line drive circuit GD and the common electrode drive circuit CD may be formed on the array substrate SUB1, and may be partially or entirely built in the driving IC chip IC1. The layout of the drive circuits is not restricted to the illustrated example. For example, there may be scanning line drive circuits GD arranged on both sides of the display area DA so as to interpose it therebetween.

The scanning lines G (1 to n) are drawn out to the non-display area ED and connected to the scanning line drive circuit GD. The signal lines S are drawn out to the non-display area ED and connected to the signal line drive circuit SD. The common electrodes CE are drawn out to the non-display area ED and connected to the common electrode drive circuit CD. In this embodiment, the driving IC chip IC1 contains the signal line drive circuit SD and the common electrode drive circuit CD. The driving IC chip IC1 is connected to the first FPC 20 joined to the short side end edge of the array substrate SUB1.

FIG. 3 is an equivalent circuit of a pixel PX shown in FIG. 2.

Each pixel PX comprises a switching element SW, a pixel electrode PE, a common electrode CE, a liquid crystal layer LC and the like. The switching element SW is constituted by a thin film transistor (TFT), for example. The switching element SW is electrically connected to the scanning line G and the signal line S. The pixel electrode PE is electrically connected to the switching element SW. The pixel electrode PE opposes the common electrode CE and drives the liquid crystal layer LQ by an electric field produced between the pixel electrode PE and the common electrode CE. A storage capacitance CS is formed between, for example, the common electrode CE and the pixel electrode PE.

Figure 4:
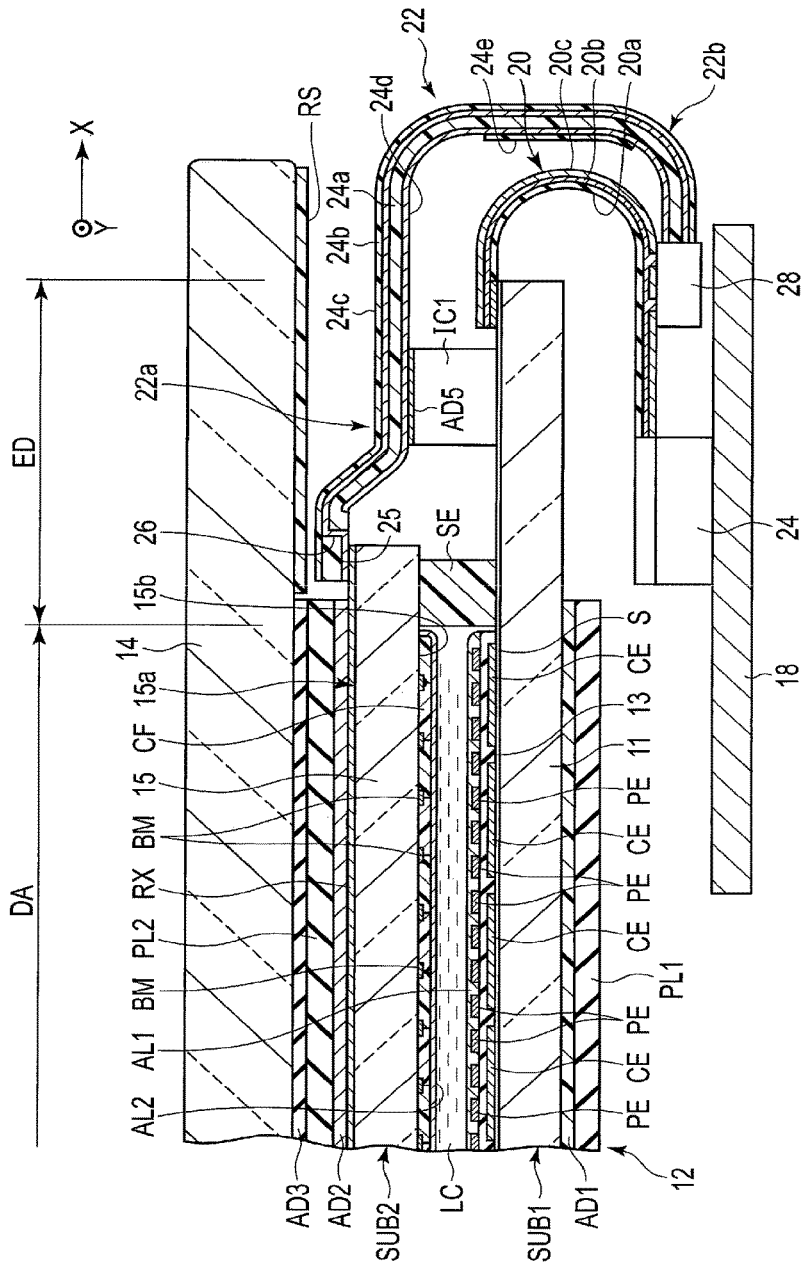
FIG. 4 is a cross sectional view taken along line A-A in FIG. 1, schematically showing a part of the structure of the display device.

FIG. 4 is a cross sectional view schematically showing the structure of the liquid crystal display device in part, taken along the line A-A in FIG. 1.

As described above, the display panel 12 includes the array substrate SUB1, counter-substrate SUB2 opposing the array substrate SUB1 and liquid crystal layer LC held between the array substrate SUB1 and the counter-substrate SUB2. The periphery of the counter-substrate SUB2 is adhered to the array substrate SUB1 with a sealant SE. The liquid crystal layer LC is sealed inside the sealant SE between the array substrate SUB1 and the counter-substrate SUB2. A polarizer PL2 is adhered to the surface of the counter-substrate SUB2 to form the display surface 12. A polarizer PL1 is adhered to the surface of the array substrate SUB1 (the rear surface of the liquid crystal display panel 12).

The display panel 12, here, has a structure corresponding mainly to a display mode which uses a lateral electric field parallel to the substrate surface, but it is not limited to this. It may have a structure corresponding to a display mode which uses a vertical electric field perpendicular to the substrate surface, or an electric field oblique to the major surface of the substrate, or a combination of these. In the display mode using a lateral electric field, the structure in which, for example, both of the pixel electrode PE and the common electrode CE are provided in the array substrate SUB1 is applicable. In the display mode using a vertical or oblique electric field, the structure in which, for example, the pixel electrode PE is provided in the array substrate SUB1 and the common electrode CE is provided in the counter-substrate SUB2 is applicable.

The array substrate SUB1 is formed of a light-transmissive first insulating substrate 11 such as a glass substrate or a resin substrate. The array substrate SUB1 comprises, on the surface side opposing the counter-substrate SUB2 of the first insulating substrate 11, a first insulating film and second insulating film, not illustrated, the above-described signal lines S, scanning lines G, common electrodes CE, third insulating film 13, pixel electrodes PE, first alignment film AL1 and the like. Note that illustration of the switching element, scanning line auxiliary capacity and various insulating films interposed therebetween, which constitute pixel PX is omitted here.

Each signal line S is formed on the first insulating film and electrically connected to the source electrode of the switching element of each respective pixel PX. The drain electrode of each switching element and the like are formed on the first insulating film. The second insulating film is disposed on the signal lines S and the first insulating film 11. The common electrodes CE are formed on the second insulating film. The common electrodes CE are formed of a transparent conductive material such as indium tin oxide (ITO) or indium zinc oxide (IZO). In the drawing, the common electrodes CE are formed on the entire display area DA, but they may be partially removed.

The third insulating film 13 is disposed on the common electrodes CE and the second insulating film 12. The pixel electrodes PE are formed on the third insulating film 13. Each of the pixel electrodes PE opposes the common electrode CE via the third insulating film. The pixel electrodes PE are formed from a transparent conductive material such as ITO or IZO. The first alignment film AL1 covers the pixels electrodes PE and the third insulating film 13.

Note that the stacking relationship between the pixel electrode PE and the common electrode CE may be reversed, or more specifically, may be stacked in the order of the insulating substrate, pixel electrode, insulating film and common electrode. Moreover, the pixel electrode and the common electrode may be formed as the same layer (the same plane) through an insulating film.

The counter-substrate SUB2 is formed using a light-transmissive second insulating substrate 15 such as a glass substrate and a resin substrate. The counter-substrate SUB2 comprises black matrixes BM, a color filter CF, a second alignment film AL2 and the like on a second surface 15*b* opposing the array substrate SUB1 of the second insulating substrate 15.

The black matrixes BM are formed on the second surface 15*b* of the second insulating substrate 15, so as to divide the pixels PX from each other as a compartment. The color filter CF is formed on the second surface 15*b* of the second insulation substrate 15 to partially overlap the black matrixes BM. The color filter CF includes, for example, a red filter disposed in a pixel displaying a red color, a green filter disposed in a pixel displaying a green color and a blue filter disposed in a pixel displaying a blue color. The second alignment film AL2 covers the color filter CF.

Note that a pixel displaying a white color or a transparent color filter may be added. Further, the color filter CF may be provided on the array substrate SUB1. Furthermore, in place of providing a BM, the light-shielding portion may be formed by superimposing ends of color filters CF on one another.

In this embodiment, the counter-substrate SUB2 comprises a plurality of detection electrodes Rx formed on the first surface (display surface) 15*a* of the second insulating substrate 15, which is on a side opposite to the array substrate SUB1. In the illustrated example, the detection electrodes Rx are in contact with the first surface 15*a*, but an insulating member may intervene between the first surface 15*a* and the detection electrodes Rx. The detection electrodes Rx are formed of a conductive transparent material. Such a conductive transparent material is, for example, an oxide material such as ITO or IZO. The oxide material should preferably include any at least one of indium, tin, zinc, gallium and titanium. The transparent conductive material is not particularly limited to an oxide material, but may be formed from a conductive organic material, fine dispersions of a conductive substance or the like. Moreover, the detection electrodes Rx may be formed not only from the transparent material described above, but from a conductive film containing a metal layer or alloy layer which comprises one or more elements selected from the group consisting s of aluminum (Al), copper (Cu), silver (Ag), molybdenum (Mo), chromium (Cr) and tungsten (W). The conducting film is subjected to blackening or mesh processing to make it invisible.

The polarizer PL1 formed of an optical element is adhered to the bottom surface of the array substrate SUB1 with a transparent adhesive AD1. The polarizer PL2 formed of an optical element is adhered to the first surface 15a of the counter-substrate SUB2 with a transparent adhesive AD2 to be overlaid on the detection electrodes Rx. The polarizers PL1 and PL2 oppose each other while interposing the display area AD therebetween. The polarizer PL1 and PL2 are arranged to be, for example, in a cross-Nicol positional relationship in which absorption axes of the respective polarizers orthogonally intersect each other. Note that the optical elements may include a retardation film as needed.

The cover panel 14 is adhered to be overlaid on the polarizer PL2 with a transparent adhesive AD3. The cover panel 14 covers the display panel 12 while opposing the display area DA of the display panel 12.

Note that the detection electrodes Rx described above are formed in the first surface 15a of the counter-substrate SUB2, but may be formed in the second surface 15b of the counter-substrate SUB2. Alternatively, the detection electrodes Rx may be formed in the cover panel 14.

FIG. 5 is an enlarged cross sectional view schematically showing the mounting portion of the array substrate SUB1a, on which the driving IC chip IC1 is mounted. As shown in FIGS. 2 and 5, a plurality of wiring layers which form the signal lines S, scanning lines G and common electrodes CE, namely, for example, an ITO wiring layer and a Ti/Al metal multilayer W2 extend out from the display area DA over to the non-display area ED of the array substrate SUB1. That is, in the non-display area ED, the ITO wiring layer W1 and the Ti/Al metal multilayer W2 are formed on the surface of the first insulating substrate 11. In the non-display area ED, the driving IC chip IC1 is mounted on the surface of the first insulating substrate 11 and electrically connected to the ITO wiring layer W1 and/or the Ti/Al metal multilayer W2. In this embodiment, the driving IC chip IC1 is mounted on the first insulating substrate 11 so as to interpose the anisotropic conductive films (ACF) 31 therebetween, and a plurality of vamps 32 of the driving IC chip IC1 are electrically connected to the ITO wiring layer W1 and/or the Ti/Al metal multilayer W2 through the ACF 31.

As shown in FIGS. 1 and 4, the first FPC 20 includes one end joined to the short side edge of the array substrate SUB1 and the other end connected to the control circuit board 18 through the connector 24. The first FPC 20 includes a base insulating layer 20a, a conductive layer, for example, a copper foil, stacked on the base insulating layer 20a and forming a plurality of wiring lines (second wiring lines) 20b, and a protective insulation layer 20c stacked on the base insulating layer 20a and the wiring lines 20b. In the one end of the first FPC 20, these wiring lines 20b are connected to the wiring lines of the array substrate SUB1 through the ACF, and are electrically connected to the driving IC chip IC1 through these wiring lines. The control circuit board 18 is disposed to oppose the rear surface of the array substrate SUB1. The first FPC 20 is drawn out from the short side of the array substrate SUB1, and then bent back towards the rear side of the array substrate SUB1 so as to be connected to the connector 24 on the control circuit board 18. With this structure, the first FPC 20 electrically connects the array substrate SUB1, the driving IC chip IC1 and the control circuit board 18 together to supply a control signal, a video signal, etc., output from the control circuit board 18 to the driving IC chip IC1 and the array substrate SUB1.

Note that the first FPC 20 is illustrated in connection with the case where it includes one single conductive layer, but the structure is not limited to this. The conductive layer may have a multilayered structure of two or more layers stacked through insulating layers. Moreover, the control circuit board 18 is illustrated to be arranged on the rear surface of the array substrate, but the structure is not limited to this. The control circuit board 18 may be arranged parallel to the display panel.

Figure 6:
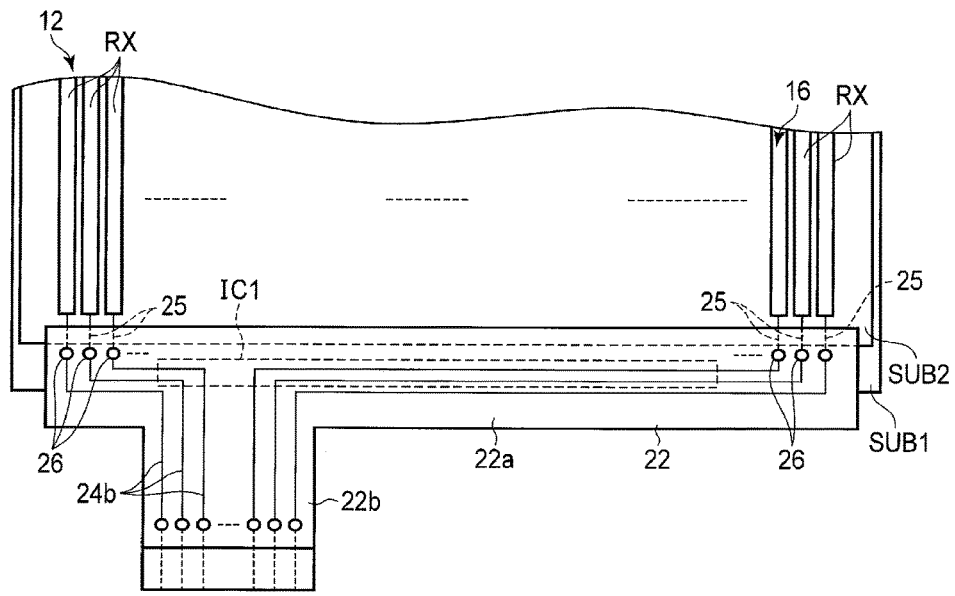
FIG. 6 is a plan view of the display panel and a second FPC joined thereto.

FIG. 6 is a plan view schematically showing the second FPC joined to the counter-substrate SUB2. As shown in FIGS. 4 and 6, the second FPC 22 includes a wide substrate-side end portion 22a and a narrow projecting end portion 22b extending from the substrate-side end. Further, the second FPC 22 includes a base insulating layer 24a formed from an insulating resin such as polyimide, a conductive layer stacked on one surface (first surface) of the base insulating layer 24a to form a plurality of wiring lines (first wiring lines) 24b, a protective insulation layer 24c overlaid on the base insulating layer 24a and the wiring lines 24b and a heat radiation layer (radiation pads) 24d stacked on the surface (second surface) of another side of the base insulating layer 24a. The heat radiation layer 24d is formed of a material having a thermal conductivity higher than that of the insulated resin such as polyimide used for the base insulating layer, that is, for example, a metal material such as copper or aluminum. In this embodiment, the heat radiation layer 24d is formed of the same metal material as that of the conductive layer, for example, a copper foil.

The heat radiation layer 24d is formed entirely over at least a joint surface of the second FPC 20, which opposes the driving IC chip IC1. In this embodiment, the heat radiation layer 24d is formed over the entire second surface of the base insulating layer 24a. The expression "over an entire surface" should just be the substantially entire surface, and therefore even if the surface is partially not covered according to a manufacture error or the like, such a surface can be included as the substantially entire surface.

Moreover, the second FPC 22 may include a protective insulation layer 24e which cover at least a part of the heat radiation layer 24d. The protective insulation layer 24e opposes the first FPC 20. Note that the protective insulation layer 24e may be formed over the entire surface of the second FPC 22 so as to open only the joint surface part opposing the driving IC chip IC1.

The substrate side end portion 22a of the second FPC 22 has a width substantially equal to the short side of the counter-substrate SUB2 and is joined to the short-side end edge of the counter-substrate SUB2. Moreover, the second FPC 22 is arranged in such a direction that the heat radiation layer 24d side thereof opposes the display panel 12 and the first FPC 20. According to this embodiment, the second FPC 22 includes a number of connection terminals 25 formed on another surface of the base insulating layer 24a (the surface on the heat radiation layer 24d side) in the end edge of the substrate side end portion 22a. The connection terminals 25 are electrically connected to the wiring lines 24b through contact holes (through-holes) 26. The connection terminals 25 are joined to the counter-substrate SUB2 by, for example, the ACF, and electrically connected to the detection electrodes Rx, respectively.

The substrate side end portion 22a of the second FPC 22 is drawn out from the counter-substrate SUB2, to cover the non-display area ED of the array substrate SUB1 and the driving IC chip IC1. Further, the substrate side end portion 22a and the projecting end portion 22b are bent towards the rear side of the array substrate SUB1, and the projecting end of the second FPC 22 is connected to the connector 28 mounted in the first FPC 20, to be connected to the wiring lines of the first FPC 20 through the connector 28. Thus, the detection electrodes Rx are electrically connected to the control circuit board 18 through the wiring lines 24b of the second FPC 22 and the first FPC 20.

Note that as aforementioned, the second FPC 22 may be directly connected to the control circuit board 18 without through the first FPC 20. Moreover, the second FPC 22 may be connected to the array substrate SUB1 as long as it covers the driving IC chip IC1.

The substrate side end portion 22a of the second FPC 22 is brought into contact with the driving IC chip IC1, and the heat radiation layer 24d of the second FPC 22 is thermally coupled with the driving IC chip IC1. More specifically, the heat radiation layer 24d is in contact by plane with the entire upper surface of the driving IC chip IC1. In this embodiment, the heat radiation layer 24d is adhered onto the upper surface of the driving IC chip IC1 with an adhesive AD5 having high thermal conductivity. Note here that when the heat radiation layer 24d can be certainly brought into contact with the driving IC chip IC1 by the elasticity of the second FPC 22 or bending thereof, the adhesive AD5 may be omitted. Moreover, a pressing member such as a spacer may be provided between the second FPC 22 and the cover panel 14 to press the heat radiation layer 24d of the second FPC 22 against the driving IC chip IC1 with this pressing member.

As described above, the display device 10 has the configuration that a large number of pixels PX in the display area DA are driven by the control circuit board 18 and the driving IC chip IC1, and thus the IC chip IC1 generates heat. However, the heat propagates to the heat radiation layer 24d of the second FPC 22 to diffuse within the heat radiation layer 24d and radiate from the surface thereof. Further, the heat partially transmits from the heat radiation layer 24d to the connector 28 and the first FPC 20, so as to be diffused and radiated. Thus, the heat of the driving IC chip IC1 is released to the heat radiation layer 24d of the second FPC 22, thereby suppressing the temperature rise in the driving IC chip IC1. Thus, it is possible to prevent the driving IC chip IC1 from having high temperature.

The second FPC 22 including the heat radiation layer 24d can be formed from a material similar to that of a general FPC without having to employ a special material, and also into a structure similar to that of a general FPC. Therefore, the measures against heat generated by the driving IC chip IC1 can be realized by the second FPC 22 without causing an increase in manufacturing cost.

Note that in the second FPC 22, substantially the entire surface of the heat radiation layer 24d is exposed to have high heat radiation property, but if there is a portion where the interference between the heat radiation layer 24d and the first FPC 20 is not desirable, such a portion may be covered with the protective insulation layer 24e. For example, the portion of the heat radiation layer 24d, which may be brought into contact with an opening for grounding of the first FPC 20, may be covered by the protective insulation layer 24e. Further, the heat radiation layer 24d may not necessarily be provided on the entire surface of the second FPC 22, but the area of the layer formed may be changed appropriately in consideration of the heat radiation effect. For example, in the region opposing the grounding opening of the first FPC 20, the heat radiation layer 24d may be removed. Furthermore, the heat radiation layer 24d may not be in contact with the entire surface of the driving IC chip IC1. In other words, the heat radiation layer 24d can exhibit its heat radiation effect as long as it is in contact with at least a part of the driving IC chip CI1. Furthermore, the driving IC chip IC1 may not necessarily be mounted near the long side of the array substrate SUB1, but it may be mounted near the short side of the array substrate SUB1 in the non-display area. In this case, the first FPC 20 and the second FPC 22 are joined to the long-side end edges of the array substrate SUB1 and the counter-substrate SUB2, to extend out from the long side of the array substrate and the counter-substrate.

Next, display devices according to another embodiment and modified example will be described. Note that in the following further embodiment and modified example, the same structural members as those of the first embodiment provided above will be designated by the same reference numbers, and detailed descriptions thereof will be omitted or simplified. The following descriptions are mainly focusing on the distinctive parts with respect to the first embodiment.

Second Embodiment

Figure 7:
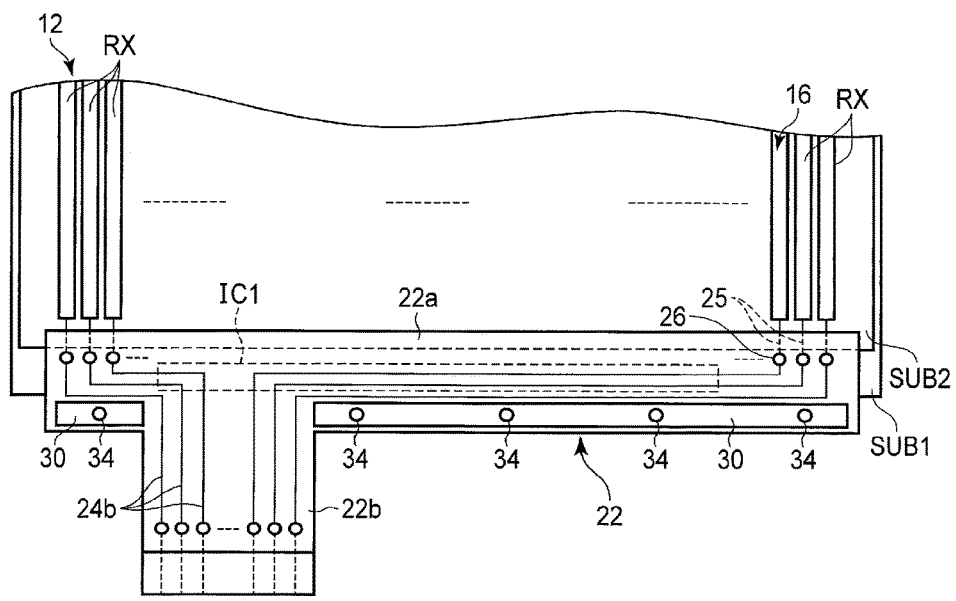
FIG. 7 is a plan view schematically showing a display panel of a display device, and a second FPC according to the second embodiment.

FIG. 7 is a plan view schematically showing a display panel and a second FPC provided in a display device according to a second embodiment. FIG. 8 is a cross sectional view schematically showing a part of the structure of the display device according to the second embodiment.

As shown in FIGS. 7 and 8, according to the second embodiment, a second FPC 22 connected to detection electrodes Rx further comprises a second heat radiation layer (radiation pads) 30 provided on an upper surface of a base insulating layer 24a, in addition to a heat radiation layer 24d provided on a bottom surface of the base insulating layer 24a.

For example, two second heat radiation layers 30 are formed on a substrate side end portion 22a of the second FPC 22 in a region where there is no wiring lines 24b or a region which avoids wiring lines 24b. The second heat radiation layer 30 is formed of a material having a thermal conductivity higher than that of the insulating resin which forms the insulating layer. In this embodiment, the second heat radiation layer 30 is formed from a conductive film used commonly for the wiring lines 24b, that is, for example, copper foil. Further, the second heat radiation layer 30 is connected to the lower surface-side heat radiation layer 24d via a plurality of contact holes 34, that is, thermally coupled therewith.

With the above-described structure, the heat of the driving IC chip IC1 propagates to the heat radiation layer 24d of the second FPC 22, and then diffuses in the heat radiation layer 24d and radiates from the surface thereof. Further, the heat partially diffuses in the second heat radiation layer 30 from the heat radiation layer 24d through the contact holes 34, so as to be radiated from the second heat radiation layer 30 to the outside. Thus, with the second heat radiation layer 30, the heat radiation area is increased, and the heat of the driving IC chip IC1 can be efficiently diffused and radiated.

FIG. 9 is a cross sectional view showing a part of a display device according to a first modified example. According to the first modified example, a display device 10 comprises a support frame 50 arranged around a display panel 12. The support frame 50 is formed from, for example, a metal plate and constitutes a bezel or housing of the display device. A second heat radiation layer 30 of a second FPC 22 is in contact with the support frame 50. For example, the second heat radiation layer 30 is in contact by lane with an inner surface of the support frame 50. With the elasticity of the second FPC 22, the second heat radiation layer 30 is tightly brought into contact with the inner surface of the support frame 50. Alternatively, the second heat radiation layer 30 may be adhered to the inner surface of the support frame 50 with an adhesive having heat-conductivity.

According to the first modified example having the above-described structure, the heat transferred from the driving IC chip IC1 to the second heat radiation layer 30 of the second FPC 22 can be propagated to and diffused in the support frame 50, to be further radiated from the support frame 50. With this structure, the heat radiation effect for the driving IC chip IC1 can be further enhanced.

FIG. 10 is a plan view schematically showing an engaged portion between a projecting end of a second FPC 22 and a connector in a display device according to the second embodiment. According to the second embodiment, as shown in FIGS. 8 and 10, a reinforcing board (heat radiation board) 52 is adhered to a connector 28 mounted on a first FPC 20. The reinforcing board 52 is fixated to the first FPC 20 with fixing pads 53. The reinforcing board 52 is formed of a material having a thermal conductivity higher than that of the insulating resin, that is, for example, a metal plate such as of stainless steel or aluminum. The reinforcing board 52 is formed into, for example, a rectangular shape, and has a plane area larger than that of the connector 28.

The projecting end portion 22b of the second FPC 22 is connected to the connector 28, and wiring lines 24b of the second FPC 22 are electrically connected to wiring lines 20b of the first FPC 20 through a connector 28. In the projecting end portion 22b, the heat radiation layer 24d is connected or thermally coupled with the reinforcing board 52 via a plurality of contact holes 54. With this structure, the heat transmitted from the driving IC chip IC1 to the heat radiation layer 24d at least partially propagates from the connector 28 to the reinforcing board 52 and diffuses therein, and is further radiated from the reinforcing board 52 to the outside. Thus, it is possible to further enhance the heat radiation effect for the driving IC chip IC1.

The connector 28 including the reinforcing board 52 may be formed not only in the first FPC 20 but also in the control circuit board 18. In this case, the projecting end portion 22b of the second FPC 22 is electrically connected to the control circuit board 18 through the connector 28. At the same time, the heat radiation layer 24d are thermally coupled with the reinforcing board 52 through the contact holes 54.

In the display device 10 according to the second embodiment, the other structure is identical to that of the display device of the first embodiment described above. With the second embodiment of the above-described structure, it is possible to suppress the temperature rise in the driving IC chip IC1, thereby preventing the driving IC chip IC1 and its surroundings from increasing their temperatures excessively high.

Third Embodiment

FIG. 11 is a plan view schematically showing a display panel and a second FPC of a display device according to the third embodiment. According to the embodiment, an array substrate SUB1 of a display panel 12 includes radiation pads 56a and 56b provided on an upper surface of a first insulating substrate 11 in a non-display area ED. The radiation pads 56a and 56b are arranged on both sides of the driving IC chip IC1. The radiation pads 56a and 56b are formed from a glass-made first insulating substrate 11 or a material having a heat conductivity higher than that of insulating resin, that is, for example, a metal. As shown in FIG. 5 described above, an ITO wiring layer W1 and a Ti/Al metal multilayer W2, constitute wiring lines, are formed on the surface of the first insulating substrate 11. Thus, in this embodiment, the radiation pads 56a and 56b are formed from ITO or a Ti/Al metal multilayer, which are also used for the wiring layers W1 and W2. The structure is not limited to this, but the radiation pads may be formed by applying a highly thermally conductive material on the surface of the first insulating substrate 11.

As shown in FIG. 11, the radiation pads 56a and 56b are formed in positions which do not interfere with the wiring lines on the first insulating substrate 11. Alternatively, the radiation pads 56a and 56b may be formed in arbitrary positions, whereas the wiring lines may be formed to detour the radiation pads 56a and 56b.

The second FPC 22 is joined to the short-side side edge of the counter-substrate SUB2, and the substrate-side side end portion 22a of the second FPC 22 covers the driving IC chip IC1 on the array substrate SUB1 and the two radiation pads 56a and 56b. The heat radiation layer 24d of the second FPC 22 is brought into contact with or adhered to the driving IC chip CI1, so as to be thermally coupled. At the same time, the heat radiation layer 24d of the second FPC 22 is brought into contact with the two radiation pads 56a and 56b or is thermally coupled.

The other structure of the display device 10 is identical to that of the display device of the first or second embodiment described above.

According to the third embodiment with the above-described structure, the heat around the driving IC chip IC1 radiates from the radiation pads 56a and 56b, to propagate to and diffuse in the heat radiation layer 24d of the second FPC 22, and further radiate from the heat radiation layer 24d to the outside. At the same time, the heat of the driving IC chip IC1 propagates to and diffuses in the heat radiation layer 24d of the second FPC 22 to be radiated from the heat radiation layer 24d to the outside. Thus, the heat of the driving IC chip IC1 can be distributed to further enhance the heat radiation. As described, also in the third embodiment, the heat of the driving IC chip IC1 can be efficiently radiated, thereby making it possible to suppress the excessive temperature increase in the driving IC chip.

Note that the embodiment is described in connection with an example case where the radiation pads 56a and 56b are formed on the array substrate SUB1, but it is not restricted to this. The radiation pads may be provided, for example, in a region of the second substrate (for example, the counter-substrate SUB2), where the detection electrodes Rx and the connection lines are not formed. It suffices if the radiation pads are provided at positions which can be thermally coupled with the heat radiation layer 24d of the second FPC 22.

Figure 12:
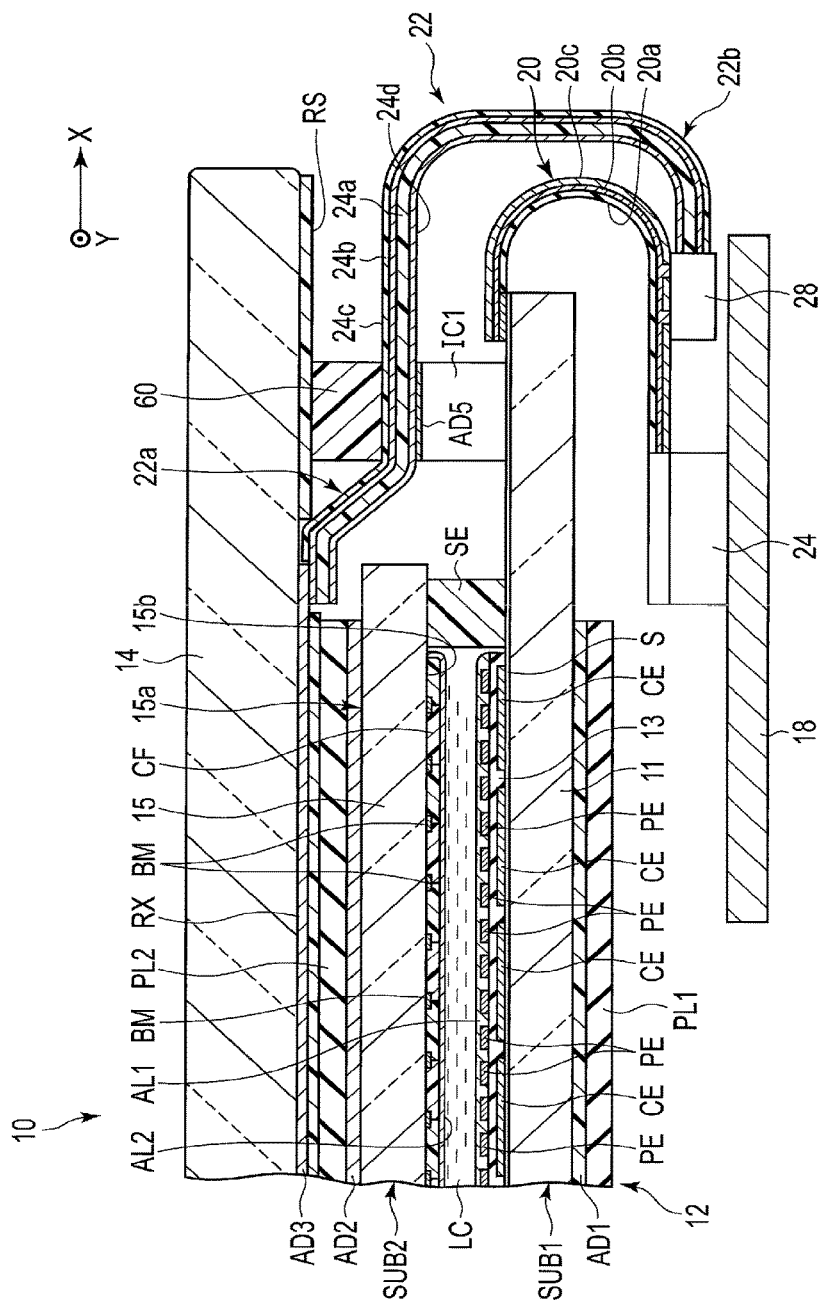
FIG. 12 is a cross sectional view schematically showing a part of the structure of a display device according to the second modified example.

FIG. 12 is a cross sectional view showing a part of a display device according to the second modified example. As described above, detection electrodes Rx may not be formed on a first surface 15a of a counter-substrate SUB2, but may be on a second surface 15b of the counter-substrate SUB2. Alternatively, the detection electrodes Rx may be formed in the cover panel 14.

As shown in FIG. 12, according to the second modified example, the detection electrodes Rx which constitute a touch sensor are provided on an inner surface of the cover panel 14, that is, the surface on the display panel 12 side. Thus, the cover panel 14 constitutes the second substrate (the fifth substrate) on which the detection electrodes Rx are formed. A polarizer PL2 formed from an optical element is adhered to the first surface 15a of the counter-substrate SUB2 with a transparent adhesive AD2. The cover panel 14 and the detection electrodes Rx are adhered to be overlaid on the polarizer PL2 with a transparent adhesive AD3.

A substrate-side end portion 22a of a second FPC 22 is joined to an inner surface of the cover panel 14 by ACF or the like, and wiring lines 24b of the second FPC 22 is connected to the detection electrodes Rx. In this case, since the wiring lines 24b are located on the cover panel 14 side, and therefore it can be directly connected to the detection electrodes Rx without the necessity of connection terminals or contact holes formed in the second FPC 22. The heat radiation layer 24d of the second FPC 22 is in contact with or thermally coupled with the driving IC chip IC1.

As an example of pressing member, a spacer 60 is provided between the substrate-side end portion 22a of the second FPC 22 and the cover panel 14. The spacer 60 is formed of, for example, a synthetic resin, and has elasticity. The spacer 60 pushes the second FPC 22 against the driving IC chip IC1 to hold the driving IC chip IC1 in a tight state. In this case, the adhesive AD5 may be omitted. Even if omitted, the heat radiation layer 24d can be tightly attached to the driving IC chip IC1 by the spacer 60.

In second modified example, the other structure of the display device 10 is identical to that of the display device of the first or second embodiment described above. With the second modified example, an advantageous effect similar to that of the first or second embodiment can be obtained.

Additionally, the detection electrode may not necessarily be formed on the cover panel 14, but may be on a substrate different from that constituting the display panel 12. For example, a substrate different from the array substrate or counter-substrate may be provided on the counter-substrate, detection electrodes may be formed on a surface or rear surface of the substrate. In this case, the substrate provided on the counter-substrate corresponds to the second substrate.

Fourth Embodiment

Figure 13:
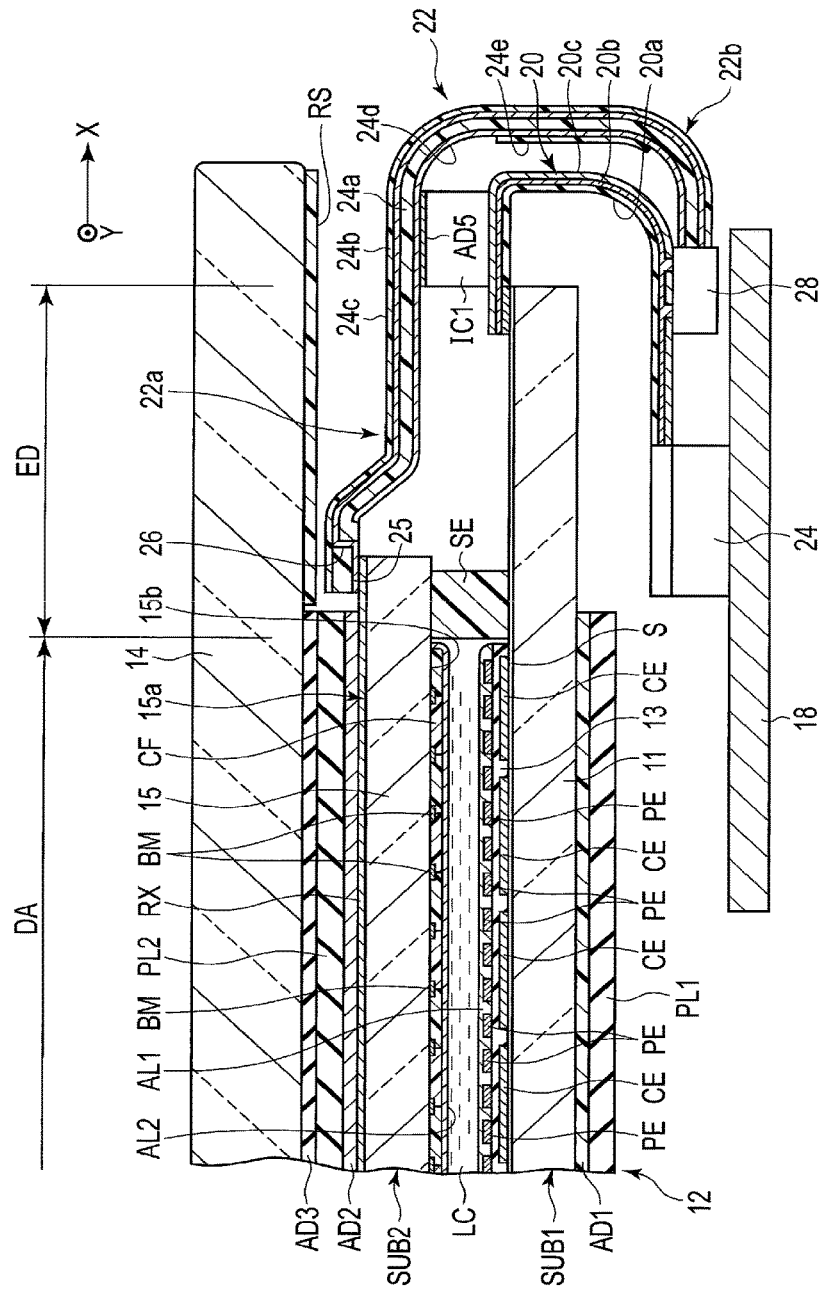
FIG. 13 is a cross sectional view schematically showing a part of structures of an according to the fourth embodiment display device.

FIG. 13 is a cross sectional view schematically showing a part of the structure of a display device according to the fourth embodiment. In various embodiment described above, the driving IC chip is mounted in the first substrate or the array substrate, but the structure is not limited to this. The driving IC chip may be provided in some other place. As shown in FIG. 13, according to the fourth embodiment, a driving IC chip IC1 is mounted on a first FPC 20 so as to be electrically connected to wiring lines 20b of a first FPC 20. Thus, the driving IC chip IC1 is electrically connected to various wiring lines of the array substrate SUB1 through the wiring lines 20b of the first FPC 20.

The driving IC chip IC1 is disposed the first FPC 20 in the vicinity of the array substrate SUB1. A substrate-side end portion 22a of a second FPC 22 is in contact with the driving IC chip IC1 and a heat radiation layer 24d of the second FPC 22 is thermally coupled with the driving IC chip IC1. That is, the heat radiation layer 24d is in contact by plane with the entire upper surface of the driving IC chip IC1. In this embodiment, the heat radiation layer 24d is adhered to the upper surface of the driving IC chip IC1 with an adhesive AD5 having high thermal conductivity. Note that when the heat radiation layer 24d can be certainly brought into contact with the driving IC chip IC1 by the elasticity of the second FPC 22 or bending thereof, the adhesive AD5 may be omitted. Moreover, a pressing member such as a spacer may be provided between the second FPC 22 and the cover panel 14 to press the heat radiation layer 24d of the second FPC 22 against the driving IC chip IC1 with this pressing member.

In the display device 10 according to the fourth embodiment, the other structure is identical to that of the display device of the first embodiment described above. Alternatively, as the other structure, that of the second or third embodiment or the first or second modified example may be adopted.

With the fourth embodiment of the above-described structure, it is possible to suppress the temperature rise in the driving IC chip IC1, thereby preventing the driving IC chip IC1 and its surroundings from increasing their temperatures excessively high.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Based on the structures and manufacturing process which have been described in the above-described embodiment and variations, a person having ordinary skill in the art may achieve structures and process with arbitral design changes; however, as long as they fall within the scope and spirit of the present invention, such structures and processes are encompassed by the scope of the present invention. Furthermore, regarding the present embodiments, any advantage and effect those will be obvious from the description of the specification or arbitrarily conceived by a skilled person are naturally considered achievable by the present invention.

What is claimed is:

1. A display device comprising: a first substrate having a first side surface;
   a plurality of pixels arranged on the first side surface of the first substrate;
   a second wiring arranged on the first surface of the first substrate and connected to the pixels;
   a drive circuitry having a first side surface and a second side surface opposite to the first side surface of the drive circuitry and including a bump arranged on the second side surface of the drive circuitry, wherein the bump is electrically connected to the second wiring via an anisotropic conductive film;
   a second substrate having a first side surface and a second side surface opposite to the first side surface of the second substrate, wherein the second side surface of the second substrate is opposed to the first side surface of the first substrate;
   a plurality of detection electrodes arranged on the first side surface of the second substrate; and
   a third substrate comprising: a base insulating layer having a first side surface and a second side surface opposite to the first side surface of the base insulating layer and including contact holes,
   a plurality of connecting portions arranged on the second side surface of the base insulating layer and connected to the detection electrodes,
   a plurality of first wiring lines arranged on the first side surface of the base insulating layer and connected to the connecting portions via the contact holes; and
   a heat radiation layer arranged on the second side surface of the base insulating layer and thermally connected to the first side surface of the drive circuitry,
   wherein at least one of the first wiring lines overlaps the drive circuitry via the heat radiation layer and the base insulating layer.

2. The display device of claim 1, wherein the heat radiation layer has a thermal conductivity higher than that of the base insulating layer.

3. The display device of claim 2, wherein the heat radiation layer is adhered to the first side surface of the drive circuitry with an adhesive having thermal conductivity.

4. The display device of claim 1, wherein the heat radiation layer is entirely on a region opposing the first side surface of drive circuitry.

5. The display device of claim 1, wherein the heat radiation layer is entirely on the second side surface of the base insulating layer.

6. The display device of claim 1, further comprising: a fourth substrate having a first side surface and a second side surface opposite to the first side surface of the fourth substrate; and
- a plurality of third wiring lines arranged on the second side surface of the fourth substrate and connected to the pixels, wherein
- the third substrate is comprised of a protective insulation layer arranged on the second side surface of the base insulating layer opposite to the first side surface of the fourth substrate, and
- the protective insulating layer covers at least a part of the heat radiation layer.

7. The display device of claim 1, wherein
- the third substrate is comprised of a second heat radiation layer on the first side surface of the base insulating layer in a region detouring the first wiring lines, and
- the second heat radiation layer is connected to the heat radiation layer through a second contact hole.

8. The display device of claim 7, further comprising:
a support frame around the first substrate, wherein
the second heat radiation layer is brought into contact with the support frame.

9. The display device of claim 1, further comprising:
a fourth substrate comprising a plurality of third wiring lines to be connected to the pixels, and
a first connector on the third substrate, wherein
the third substrate is comprised of an end portion connected to the first connector and so electrically connected to the fourth substrate.

10. The display device of claim 9, further comprising:
a heat radiation plate brought into contact with the first connector, wherein
the heat radiation layer of the third substrate is thermally coupled with the heat radiation plate.

11. The display device of claim 1, further comprising:
a heat radiation pad on the first substrate and located near the drive circuitry, wherein
the heat radiation layer is thermally connected to the heat radiation pad.

12. The display device of claim 1, further comprising: a pressing member which pushes the third substrate in a direction in which the heat radiation layer is brought into contact with the first side surface of the drive circuitry.

13. The display device of claim 1, further comprising: a polarizer on the first side surface of the second substrate so as to be overlaid on the detection electrodes.

14. The display device of claim 1, further comprising a fifth substrate, wherein the first substrate is an array substrate, and the second substrate is arranged between the array substrate and the fifth substrate.

* * * * *